(12) United States Patent
Araoka et al.

(10) Patent No.: US 10,770,548 B2
(45) Date of Patent: Sep. 8, 2020

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Tsuyoshi Araoka, Matsumoto (JP); Mitsuo Okamoto, Tsukuba (JP); Yohei Iwahashi, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/277,419

(22) Filed: Feb. 15, 2019

(65) Prior Publication Data
US 2019/0267451 A1     Aug. 29, 2019

(30) Foreign Application Priority Data
Feb. 28, 2018  (JP) ................................. 2018-035073

(51) Int. Cl.
*H01L 29/16*     (2006.01)
*H01L 21/02*     (2006.01)
(Continued)

(52) U.S. Cl.
CPC ........ *H01L 29/1608* (2013.01); *H01L 21/022* (2013.01); *H01L 21/0217* (2013.01);
(Continued)

(58) Field of Classification Search
CPC ..... H01L 29/16; H01L 29/16; H01L 29/1608; H01L 29/66; H01L 29/66; H01L 29/6606;
(Continued)

(56) References Cited

U.S. PATENT DOCUMENTS

2002/0172774 A1   11/2002 Lipkin
2012/0199846 A1*   8/2012 Shimizu ............ H01L 29/66068
                                                         257/77
(Continued)

FOREIGN PATENT DOCUMENTS

JP     2004-511101 A    4/2004
JP     2012-164788 A    8/2012
(Continued)

*Primary Examiner* — Monica D Harrison
(74) *Attorney, Agent, or Firm* — Rabin & Berdo, P.C.

(57) ABSTRACT

A silicon nitride film having a thickness in a range from 1 [nm] to 3 [nm] is deposited on a front surface of a silicon carbide semiconductor base, by an ALD method. Next, on the silicon nitride film, for example, a silicon oxide film having a thickness in a range from 20 [nm] to 100 [nm] is deposited. After deposition of the silicon oxide film, for example, heat treatment is performed at a temperature in a range from 1100 degrees C. to 1350 degrees C., in a gas atmosphere that includes oxygen. By this heat treatment, nitrogen surface density of an interface of the silicon carbide semiconductor base and the silicon oxide film (gate insulating film) is increased, reducing interface state density of the interface of the silicon carbide semiconductor base and the silicon nitride film.

7 Claims, 11 Drawing Sheets

(51) Int. Cl.
*H01L 29/94* (2006.01)
*H01L 29/66* (2006.01)

(52) U.S. Cl.
CPC .... *H01L 21/0228* (2013.01); *H01L 21/02164* (2013.01); *H01L 21/02219* (2013.01); *H01L 21/02255* (2013.01); *H01L 21/02274* (2013.01); *H01L 21/02337* (2013.01); *H01L 21/02378* (2013.01); *H01L 29/6606* (2013.01); *H01L 29/94* (2013.01)

(58) Field of Classification Search
CPC ....... H01L 29/94; H01L 21/02; H01L 21/021; H01L 21/0216; H01L 21/02164; H01L 21/0217; H01L 21/022; H01L 21/02219; H01L 21/0228; H01L 21/023; H01L 21/0233; H01L 21/02337; H01L 21/0237; H01L 21/02378; H01L 21/02255; H01L 21/0227; H01L 21/02274
USPC .......................................................... 257/77
See application file for complete search history.

(56) References Cited

U.S. PATENT DOCUMENTS

2012/0217513 A1    8/2012   Tega et al.
2016/0093494 A1    3/2016   Makifuchi et al.

FOREIGN PATENT DOCUMENTS

| JP | 2012-178483 A | 9/2012 |
| JP | 2015-005669 A | 1/2015 |
| JP | 2015-142078 A | 8/2015 |

* cited by examiner

FIG.13
RELATED ART
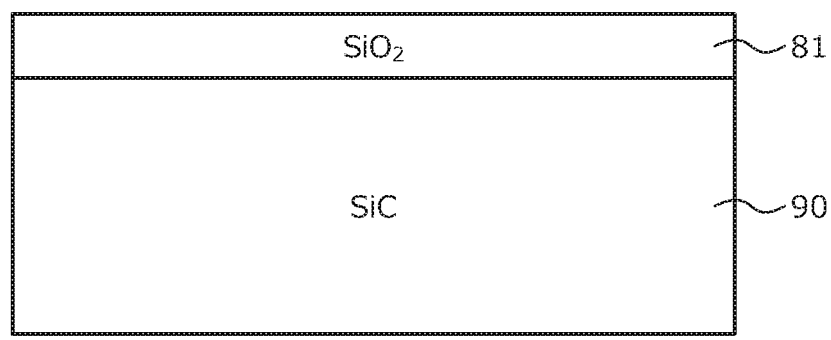
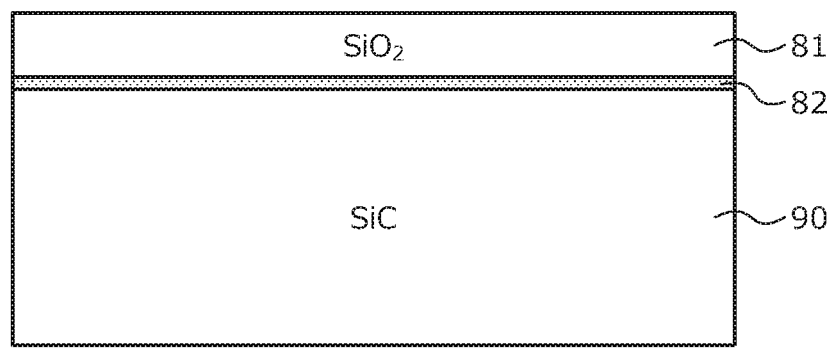

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-035073, filed on Feb. 28, 2018, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Research and development of next generation semiconductor devices using a semiconductor base (silicon carbide semiconductor base) having silicon carbide (SiC) as a semiconductor material is advancing. When silicon carbide is applied to a silicon carbide vertical metal oxide semiconductor field effect transistor (MOSFET), which is one type of a silicon carbide semiconductor device, a gate insulating film such as a silicon oxide film ($SiO_2$ film) is formed on a front surface of the silicon carbide semiconductor base.

As a method of forming the silicon oxide film on the silicon carbide semiconductor base, for example, a method of thermally oxidizing the silicon carbide semiconductor base may be given. However, an interface state occurs at an interface of the silicon carbide semiconductor base and the silicon oxide film and this interface state reduces field-effect mobility (channel mobility) of the MOSFET. With reduced channel mobility, a resistance value during ON operation of the MOSFET increases and loss may increase. Thus, interface state density is used as an index to alternatively evaluate channel mobility. In general, interface characteristics of the interface of the silicon carbide semiconductor base and the gate insulating film tend to be favorable such that the channel mobility tends to increase as the interface state density at the interface of the silicon carbide semiconductor base and the gate insulating film decreases.

As a general technique of improving interface characteristics of the silicon carbide semiconductor base and the gate insulating film, for example, according to one method, after the silicon oxide film constituting the gate insulating film is formed by heat treatment (oxidation) under a dry oxygen atmosphere, heat treatment is performed under a gas atmosphere including nitrogen atoms (N) such as nitrous oxide ($N_2O$) or nitric oxide (NO) (for example, refer to Published Japanese-Translation of PCT Application, Publication No. 2004-511101).

FIG. 13 is a cross-sectional view of a MOS capacitor during manufacture by a method of manufacturing a silicon carbide semiconductor device using a conventional technique. As depicted in FIG. 13, at a main surface of a silicon carbide semiconductor base 90, a silicon oxide film 81 constituting a gate insulating film is formed by heat treatment under a dry oxygen atmosphere. Subsequently, as depicted in FIG. 13, heat treatment is performed under a gas atmosphere including nitrogen such as nitrous oxide or nitric oxide, whereby nitrogen atoms are introduced at an interface 82 of the silicon carbide semiconductor base 90 and the silicon oxide film 81.

Further, as another technique of improving interface characteristics of the silicon carbide semiconductor base and the gate insulating film, for example, according to one method, to reduce the interface state density of a silicon carbide semiconductor base and a gate insulating film, chlorine (Cl) of a concentration of at least $1 \times 10^{19}/cm^3$ is introduced at the interface of the silicon carbide semiconductor base and the gate insulating film (for example, refer to Japanese Laid-Open Patent Publication No. 2015-142078). Japanese Laid-Open Patent Publication No. 2015-142078 describes that as a result, effects may be achieved in that dangling bonds of the interface of the silicon carbide semiconductor base and the gate insulating film reported as a cause of an interface state are terminated by the chlorine and carbon compounds segregated at the interface of the silicon carbide semiconductor base and the gate insulating film are removed.

Further, as another method of improving interface characteristics of the silicon carbide semiconductor base and the gate insulating film, is a method of oxidizing by a dry oxygen atmosphere, a surface on a side of a silicon carbide semiconductor base, the side on which a gate insulating film is formed, and performing with respect to the silicon carbide semiconductor base, a first heat treatment in an oxidizing atmosphere constituted by an oxide compound including nitrogen and thereafter, forming the gate insulating film by a second heat treatment performed in a gas ($H_2$) atmosphere including hydrogen (for example, refer to Japanese Laid-Open Patent Publication No. 2015-5669).

Further, as another method of improving interface characteristics of the silicon carbide semiconductor base and the gate insulating film is a method of forming a gate-insulating-film interface layer in a range of 1 [nm] to 5 [nm] by oxynitriding the silicon carbide semiconductor base, and forming a gate insulating film in a range from 30 [nm] to 100 [nm] by a low pressure chemical vapor deposition (LPCVD) method, an atomic layer deposition (ALD) method, a metal organic CVD (MOCVD) method, etc., using a high dielectric material including at least one species selected from among silicon oxide film, aluminum oxide ($Al_2O_3$), hafnium oxide ($HfO_2$), zirconium oxide ($ZrO_2$), and silicon nitride ($Si_3N_4$) (for example, refer to Japanese Laid-Open Patent Publication No. 2012-178483).

Further, as a method of improving interface characteristics of the silicon carbide semiconductor base and the gate insulating film is a method of substituting a portion of any one of or both elements silicon (Si) and carbon (C) in an uppermost surface layer of a silicon carbide semiconductor base, with at least one type of element selected from among nitrogen, phosphorus (P) and arsenic (As), and forming a peak of substitution-element surface density at the interface of the silicon carbide semiconductor base and the gate insulating film (for example, refer to Japanese Laid-Open Patent Publication No. 2012-164788). Japanese Laid-Open Patent Publication No. 2012-164788 discloses that a peak surface density of the peak of the substitution-element surface density at the interface of the silicon carbide semiconductor base and the gate insulating film is set to range from $1.22 \times 10^{14}/cm^2$ to $2.44 \times 10^{15}/cm^2$, and a half width of a thickness direction of the peak of the substitution-element surface density is set to range from 0.05 nm to 1.0 nm.

Japanese Laid-Open Patent Publication No. 2012-164788 discloses that as a method of forming the peak of the substitution-element surface density at the interface of the silicon carbide semiconductor base and the gate insulating film so that the peak of the substitution-element surface density at the interface of the silicon carbide semiconductor base and the gate insulating film satisfies the conditions above, immediately before gate insulating film formation, a surface process for a surface of the silicon carbide semiconductor base is performed with respect to the surface that forms the interface with the gate insulating film. As the surface process, a surface process is proposed that is performed in a gas atmosphere in which a temperature is set to be 20 degrees C., partial pressure of plasma excited nitrogen atoms (similarly for partial pressure of plasma excited phosphorus atoms, and partial pressure of plasma excited arsenic atoms) is set to be 1.0 Torr, and total pressure introducing neon (Ne) into the furnace is set to be 10 Torr, while a surface process period is set to be 60 seconds.

SUMMARY OF THE INVENTION

According to an embodiment of the present invention, a silicon carbide semiconductor device includes a semiconductor base including silicon carbide; and a gate insulating film provided on a surface of the semiconductor base. Nitrogen surface density at an interface of the semiconductor base and the gate insulating film is in a range from $6\times10^{14}/cm^2$ to $1.2\times10^{15}/cm^2$.

In the embodiment, a half width of a nitrogen profile of a thickness direction at the interface of the semiconductor base and the gate insulating film is in a range from 2 nm to 4 nm.

In the embodiment, a hydrogen volume density in the gate insulating film and at the interface of the semiconductor base and the gate insulating film is $1\times10^{21}/cm^3$ or less.

In the embodiment, the hydrogen volume density in the gate insulating film and at the interface of the semiconductor base and the gate insulating film is $1\times10^{20}/cm^3$ or less.

In the embodiment, the semiconductor base has a surface that is the interface with the gate insulating film, the surface being a (0001) plane, a (000-1) plane, a (1-100) plane, or a (11-20) plane.

According to another embodiment, a method of manufacturing a silicon carbide semiconductor device includes a first process of forming on a front surface of a semiconductor base including silicon carbide, a silicon nitride film having a thickness in a range from 1 nm to 3 nm; a second process of forming on the silicon nitride film, a gate insulating film; and causing nitrogen atoms in the silicon nitride film to react with the semiconductor base by heat treatment in an atmosphere that includes oxygen, after the second process.

In the embodiment, causing the nitrogen atoms to react with the semiconductor base includes performing the heat treatment at a temperature in a range from 1100 degrees C. to 1350 degrees C.

In the embodiment, the first process includes forming the silicon nitride film by a chemical vapor disposition method including an atomic layer deposition method.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is a cross-sectional view of a MOS capacitor during manufacture by a method of manufacturing a silicon carbide semiconductor device using a conventional technique.

DETAILED DESCRIPTION OF THE INVENTION

Figure 1:
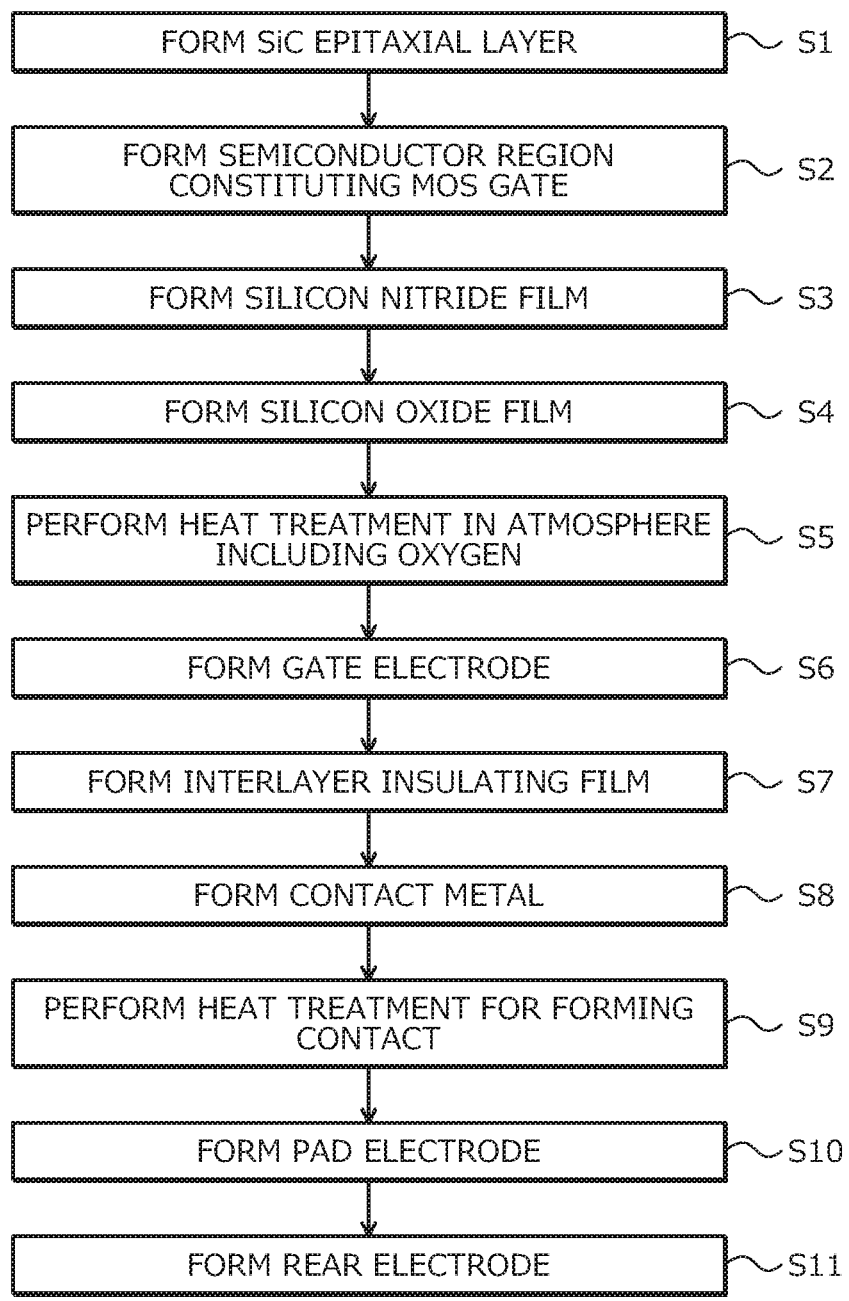
FIG. 1 is a flowchart of an outline of a method of manufacturing a silicon carbide semiconductor device according to an embodiment.

First problems associated with the conventional techniques will be described. In the conventional oxynitriding process by heat treatment using nitric oxide or nitrous oxide, it is known that even when conditions such as process time, process temperature, and gas concentration are adjusted, the amount of nitrogen introduced at the interface of the silicon carbide semiconductor base and the gate insulating film becomes saturated at substantially the same level, and the substitution-element surface density at the interface of the silicon carbide semiconductor base and the gate insulating film is limited to about $3\times10^{14}/cm^2$ to $6\times10^{14}/cm^2$. In this manner, a problem arises in that due to adverse effects of the limitation of the substitution-element surface density, the interface state density may only be reduced to a certain level and as a result, the channel mobility is low.

Embodiments of a silicon carbide semiconductor device and a method of manufacturing a silicon carbide semiconductor device according to the present invention will be described in detail with reference to the accompanying drawings. The present invention relates to the silicon carbide semiconductor device and the method of manufacturing a silicon carbide semiconductor device and particularly, is a method of manufacturing a silicon carbide semiconductor device related to reducing interface state density of an interface of a silicon carbide semiconductor base and a gate insulating film. In the present description and accompanying drawings, layers and regions prefixed with n or p mean that majority carriers are electrons or holes. Additionally, + or − appended to n or p means that the impurity concentration is higher or lower, respectively, than layers and regions without + or −. Further, in the present description and accompanying drawings, when Miller indices are described, "−" means a bar added to an index immediately after the "−", and a negative index is expressed by prefixing "−" to the index. In the description of the embodiments below and the accompanying drawings, main portions that are identical will be given the same reference numerals and will not be repeatedly described.

A method of manufacturing a silicon carbide semiconductor device according to an embodiment will be described taking as an example, a case in which a general horizontal n-channel MOSFET is manufactured. FIG. 1 is a flowchart of an outline of the method of manufacturing the silicon carbide semiconductor device according to the embodiment. Herein, processes other than at step S3 to step S5 depicted in FIG. 1 may be a method of manufacturing a general horizontal n-channel MOSFET and thickness, formation conditions, etc. of various layers may be variously modified.

First, a $p^+$-type semiconductor substrate ($p^+$-type silicon carbide substrate) having silicon carbide as a semiconductor material is prepared. As the $p^+$-type silicon carbide substrate, for example, a p-type 4H-SiC substrate having as a front surface, a face inclined about 0 degrees to 8 degrees (or a face inclined about 0 degrees to 4 degrees) from a (0001) plane of a 4-layer periodic hexagonal silicon carbide (4H-SiC) may be prepared. Next, on the front surface of the $p^+$-type silicon carbide substrate, for example, a p-type SiC epitaxial layer is formed by epitaxial growth (step S1).

By the process at step S1, the p-type epitaxial layer is stacked on the $p^+$-type silicon carbide substrate, thereby fabricating a p-type silicon carbide semiconductor base. Herein, a surface of the p-type silicon carbide semiconductor base on a first side of the p-type silicon carbide semiconductor base having the p-type epitaxial layer is regarded as a front surface, while a surface of the p-type silicon carbide semiconductor base on a second side of the p-type silicon carbide semiconductor base having the $p^+$-type silicon carbide substrate (i.e., a rear surface of the $p^+$-type silicon carbide substrate) is regarded as a rear surface. The front surface of the p-type silicon carbide semiconductor base is a (0001) plane. The front surface of the p-type silicon carbide semiconductor base may be a (000-1) plane, a (1-100) plane, or a (11-20) plane.

Next, in a surface layer of the front surface (i.e., a surface of the p-type epitaxial layer on a first side of the p-type epitaxial layer opposite a second side of the p-type epitaxial layer facing toward the $p^+$-type silicon carbide substrate) of the p-type silicon carbide semiconductor base, a semiconductor region constituting a MOS gate (insulated gate constituted by a metal, an oxide film, and a semiconductor) is formed (step S2). In particular, on the front surface of the p-type silicon carbide semiconductor base, for example, an oxide film is deposited, for example, by a low-pressure CVD method. Next, by photolithography and etching, the oxide film is patterned, and a part of the oxide film corresponding to a formation region of an $n^+$-type drain region and a part of the oxide film corresponding to a formation region of an $n^+$-type source region are each removed. Further, a resist film used in the patterning the oxide film is removed.

Next, a remaining part of the oxide film is used as a mask and for example, an n-type impurity ion such as phosphorus (P) is ion implanted at the front surface of the p-type silicon carbide semiconductor base. Ion implantation conditions of phosphorus ions may include, for example, a temperature of the p-type silicon carbide semiconductor base set to be about 500 degrees C., multi-stage ion implantation of performing plural sessions of ion implantation at differing acceleration energies in a range from about 40 keV to 250 keV, and a total implantation amount of the multi-stage ion implantation set to be about $2\times10^{20}$ cm$^3$. As a result, in the surface layer at the front surface of the p-type silicon carbide semiconductor base, two $n^+$-type impurity regions are formed separated from each other.

Next, after the remaining part of the oxide film is removed, for example, an oxide film having a thickness of 1 μm is deposited, for example, by a low-pressure CVD method. Next, by photolithography and etching, the oxide film is patterned, and a part of the oxide film corresponding to a formation region of a $p^+$-type ground region is removed. Further, a resist film used in patterning the oxide film is removed. Next, a remaining part of the oxide film is used as a mask, and a p-type impurity such as aluminum (Al) is ion implanted at the front surface of the p-type silicon carbide semiconductor base.

Ion implantation conditions of aluminum ions may include, for example, a temperature of the p-type silicon carbide semiconductor base set to about 500 degrees C., multi-stage ion implantation at an acceleration energy set in a range from about 40 keV to 200 keV, a total implantation amount of the multi-stage ion implantation set to be about $2\times10^{20}$ cm$^3$. As a result, in the surface layer at the front surface of the p-type silicon carbide semiconductor base, a $p^+$-type impurity region is formed so as to be in contact with a first $n^+$-type impurity region of the two $n^+$-type impurity regions, the $p^+$-type impurity region being in contact with the first $n^+$-type impurity region on a first side of the first $n^+$-type impurity region, opposite a second side of the first $n^+$-type impurity region facing toward a second $n^+$-type impurity region of the two $n^+$-type impurity regions.

Next, after the remaining part of the oxide film is removed, for example, in an argon atmosphere, annealing is performed for 5 minutes at a temperature of 1600 degrees C., activating impurity regions. As a result, in an active region, a first n-type impurity region is activated constituting the $n^+$-type source region, a second n-type impurity region is activated constituting the $n^+$-type drain region, and the $p^+$-type impurity region is activated constituting the $p^+$-type ground region. The active region is a region in which current flows in an ON state.

Next, for example, a field oxide film having a thickness of 0.5 μm is deposited at the front surface of the p-type silicon carbide semiconductor base, for example, by a low-pressure CVD method. Next, by photolithography and etching, the field oxide film is selectively removed, exposing the front surface of the p-type silicon carbide semiconductor base in the active region. A process of selectively removing the field oxide film, for example, may be performed by wet etching. As a result, the n$^+$-type drain region, the n$^+$-type source region, and the p$^+$-type ground region are exposed in the active region. Further, a resist film used in patterning the field oxide film is removed.

Next, after the p-type silicon carbide semiconductor base is cleaned, a first deposition process (first process) for forming a silicon nitride film (SiN film) on the front surface of the p-type silicon carbide semiconductor base is performed (step S3). In particular, in the first deposition process, for example, by an ALD method, for example, a silicon nitride film having a thickness in a range from about 1 [nm] to 3 [nm] is deposited on the front surface of the p-type silicon carbide semiconductor base. A detailed method of depositing the silicon nitride film by an ALD method will be described hereinafter using FIG. 2.

Next, a second deposition process (second process) for forming a silicon oxide film on a surface of the silicon nitride film is performed (step S4). The silicon oxide film deposited on the surface of the silicon nitride film by the second deposition process is the gate insulating film. In particular, in the second deposition process, for example, by the ALD method, for example, a silicon oxide film having a thickness in a range from about 20 [nm] to 100 [nm] is deposited on the surface of the silicon nitride film. A detailed method of depositing the silicon oxide film by the ALD method will be described using FIG. 2.

The second deposition process for forming the gate insulating film, for example, may be deposition of a high temperature oxide (HTO) film by a low-pressure CVD method in place of the ALD method. Further, as the gate insulating film, instead of forming a single-layer film in which only the silicon oxide film is stacked, a stacked film in which a nitride film, an oxynitride film, etc. is stacked on the silicon oxide film may be formed.

Next, after the second deposition process for forming the silicon oxide film, heat treatment is performed for a period of 2 minutes to 30 minutes, at a temperature in a range from 1100 degrees C. to 1350 degrees C., in an atmosphere including oxygen (O$_2$) (step S5). By the heat treatment, nitrogen atoms in the silicon nitride film are caused to react with the silicon carbide semiconductor base, forming at an interface of the silicon nitride film and the silicon carbide semiconductor base, an interface layer including nitrogen atoms. The atmosphere including oxygen and used in the heat treatment at step S5 may be an oxygen atmosphere, and may be an atmosphere including oxygen and not including nitric oxide or nitrous oxide.

After the heat treatment, when the silicon nitride film remains, nitrogen (N) is introduced at the interface of the silicon carbide semiconductor base and the silicon nitride film; and when the silicon nitride film does not remain, nitrogen (N) is introduced at an interface of the silicon carbide semiconductor base and the silicon oxide film that is the gate insulating film. In this manner, nitrogen is introduced at the interface of the silicon carbide semiconductor base and the silicon nitride film (or the silicon oxide film), whereby nitrogen surface density of the interface of the silicon carbide semiconductor base and the silicon nitride film increases, reducing interface state density of the interface of the silicon carbide semiconductor base and the silicon nitride film.

The nitrogen surface density at the interface of the silicon carbide semiconductor base and the silicon nitride film (or the silicon oxide film) is about $6 \times 10^{14}/cm^2$ to $1.2 \times 10^{15}/cm^2$.

Further, a nitrogen volume density profile of the nitrogen introduced at the interface of the silicon carbide semiconductor base and the silicon nitride film (or silicon oxide film) indicates a maximum volume density at the interface of the silicon carbide semiconductor base and the silicon nitride film (or the silicon oxide film); and distribution where volume density decreases with increasing depth inside the silicon carbide semiconductor base and inside the silicon nitride film (or the silicon oxide film) from the interface. A half width of the nitrogen volume density profile is about 2 nm to 4 nm.

Further, when the silicon nitride film and the silicon oxide film are deposited, hydrogen in the gate insulating film and mixed at the interface of the silicon carbide semiconductor base and the silicon nitride film (or the silicon oxide film) is desorbed by the heat treatment above. After the heat treatment above, volume density of the hydrogen remaining in the gate insulating film and at the interface of the silicon carbide semiconductor base and the silicon nitride film (or the silicon oxide film) may be $1 \times 10^{21}/cm^3$ or less, or may be $1 \times 10^{20}/cm^3$ or less.

Next, in the gate insulating film, a gate electrode is formed (step S6). In particular, for example, polycrystalline silicon (poly-Si) is deposited on the gate insulating film, for example, by a low-pressure CVD method. Next, by photolithography and etching, the polycrystalline silicon is patterned and a part of the polycrystalline silicon, the part spanning the n$^+$-type drain region and the n$^+$-type source region and covering the p-type epitaxial layer via the gate insulating film is left as the gate electrode. Further, a resist film used in patterning the gate electrode is removed.

Next, after the p-type silicon carbide semiconductor base is cooled until a temperature of the p-type silicon carbide semiconductor base becomes room temperature, an interlayer insulating film is formed covering a front surface side of the p-type silicon carbide semiconductor base (step S7).

Next, a contact metal in contact with the semiconductor region constituting the MOS gate is formed (step S8). In particular, by photolithography and etching, the gate insulating film and the interlayer insulating film are selectively removed, forming a contact hole exposing the n$^+$-type drain region and a contact hole exposing the n$^+$-type source region and the p$^+$-type ground region. The process of selectively removing the gate insulating film and the interlayer insulating film, for example, may be performed by wet etching using hydrofluoric acid (HF).

Next, along a surface of the interlayer insulating film and an inner wall of the contact holes, a metal film is formed. The metal film, for example, is made of nickel (Ni). The inner wall of the contact holes is the front surface of the p-type silicon carbide semiconductor base and a side surface of the interlayer insulating film exposed in the contact holes. Further, by photolithography and etching, the metal film is patterned, leaving a part of the metal film, the part on the front surface of the p-type silicon carbide semiconductor base, as a contact metal in contact with the n$^+$-type drain region and a contact metal in contact with the n$^+$-type source region and the p$^+$-type ground region. Further, a resist film used in patterning the metal film is removed.

Next, heat treatment is performed in an inert gas atmosphere as annealing for forming an ohmic contact between the metal film and the p-type silicon carbide semiconductor base (step S9). As a result, at an interface of the metal film and the p-type silicon carbide semiconductor base, metal atoms of the metal film and silicon atoms of silicon carbide semiconductor base react forming a reaction layer (electrical contact region: contact). In the heat treatment at step S9, as an inert gas, any one of a gas ($N_2$) including nitrogen, a helium gas (He) and an argon gas (Ar) is used.

Next, for example, an aluminum (Al) film having a thickness of 300 [nm] is vapor deposited on the surface of the interlayer insulating film, so as to be embedded in the contact holes. Next, by photolithography and etching, the aluminum film is selectively removed, leaving a part of the aluminum film as a pad electrode in contact with the gate electrode and as a pad electrode in contact with each reaction layer (step S10). The process of selectively removing the aluminum film, for example, may be performed by wet etching using a phosphoric acid ($H_3PO_4$). Thereafter, at the rear surface (the rear surface of the $p^+$-type silicon carbide substrate) of the p-type silicon carbide semiconductor base, for example, an aluminum film having a thickness of 100 [nm] is vapor deposited, forming a rear electrode (step S11), whereby the MOSFET (silicon carbide semiconductor device) including silicon carbide is completed.

Figure 2:
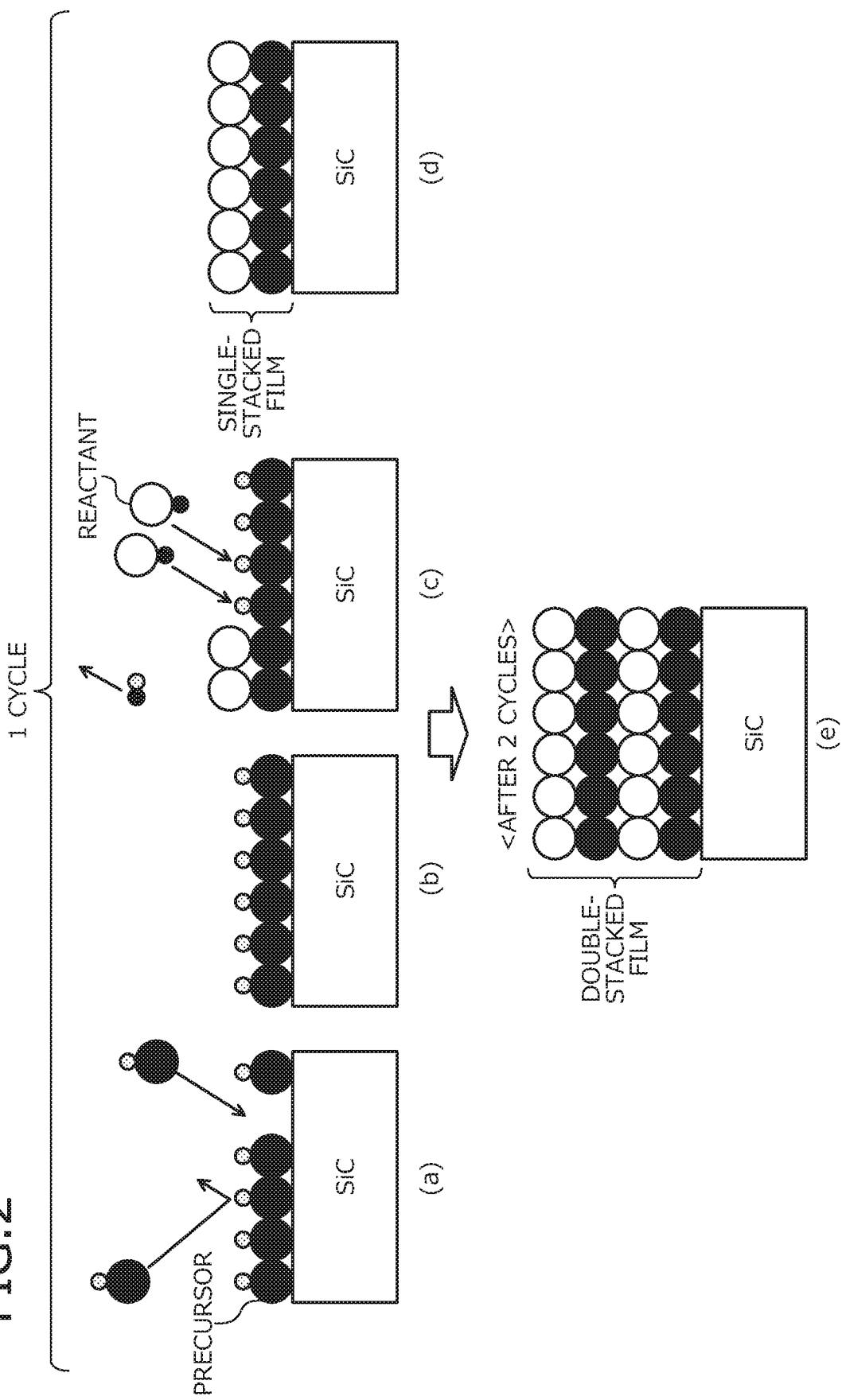
FIG. 2 is a diagram depicting an example of a process of film formation by an ALD method.

A process of film formation by an ALD method will be described. FIG. 2 is a diagram depicting an example of the process of film formation by an ALD method. The ALD method is a method of using self-regulating characteristics of atoms to form a layer having a thickness of one atom, one layer at a time. In the ALD method, for example, as one cycle, four steps from (a) to (d) depicted in FIG. 2 obtain a single-stacked film in which a 1-atom layer formed at a first step (a) and a 1-atom layer formed on the 1-atom layer at a third step (c) are stacked. First, at the first step (a) in FIG. 2, a precursor is injected into a chamber of ALD equipment. Herein, description will be given taking an example in which by the ALD method, a silicon nitride film 2 (refer to FIG. 3) is deposited. For example, when the silicon nitride film 2 is deposited, the precursor is a source gas of silicon atoms. For example, as the precursor, tris(dimethylamino)silane (3DMAS (chemical formula: $SiH[N(CH_3)_2]_3$)) is injected. The source gas of the silicon atoms is not limited to 3DMAS and may be another organic silicon compound or the like. Next, at the second step (b) in FIG. 2, a purge process in the chamber is performed. The purge process is a process of exhausting unnecessary matter. Herein, provided formation of the 1-atom layer by atoms included in the precursor is possible, the excess precursor material is exhausted.

Next, at the third step (c) depicted in FIG. 2, a reactant is injected into the chamber of the ALD equipment. For example, when the silicon nitride film 2 is deposited, the reactant is a source gas of nitrogen atoms. For example, a mixed gas of a gas ($N_2$) that includes nitrogen and a gas ($H_2$) that includes hydrogen may be the source gas of the nitrogen atoms. In the ALD equipment, the reactant is made into a plasma state and injected. As depicted at the third step (c) in FIG. 2, when the reactant is injected, deposited atoms included in the precursor and atoms included in the reactant form interatomic bonds.

Further, at the fourth step (d) depicted in FIG. 2, the purge process is performed. As a result, for example, when the silicon nitride film 2 is deposited, excess $CH_4$, $N_2$ are exhausted. Herein, provided formation of the 1-atom layer by atoms included in the reactant is possible, the excess reactant material is exhausted. On the front surface of the p-type silicon carbide semiconductor base, a deposited film is formed in which atoms included in the 1-atom layer formed by the precursor and atoms included in the 1-atom layer formed by the reactant form interatomic bonds.

In this manner, in the ALD method, the 4 steps are regarded as 1 cycle as described and the number of these cycles is adjusted, whereby a film having a predetermined thickness may be deposited. In FIG. 2, a stage (e) depicts an example where a process in which the 4 steps above are set as 1 cycle is performed for 2 cycles, forming a double-stacked film.

The process of film formation by the ALD method is applied at the first and the second deposition processes at steps S3, S4 depicted in FIG. 1. In the first deposition process for the silicon nitride film at step S3 depicted in FIG. 1, the precursor is a gas that includes silicon atoms and the reactant is a gas that includes nitrogen atoms. In the first deposition process, a silicon nitride film having a thickness of 0.17 Å per one cycle is formed. Further, in the second deposition process for the silicon oxide film at step S4 depicted in FIG. 1, the precursor is a gas that includes silicon atoms and the reactant is a gas that includes oxygen atoms. In the second deposition process, a silicon oxide film having a thickness of 0.67 Å per 1 cycle is formed.

Next, a method of manufacturing an n-type MOS capacitor using the method of manufacturing the silicon carbide semiconductor device according to the embodiment will be described.

Figure 3:
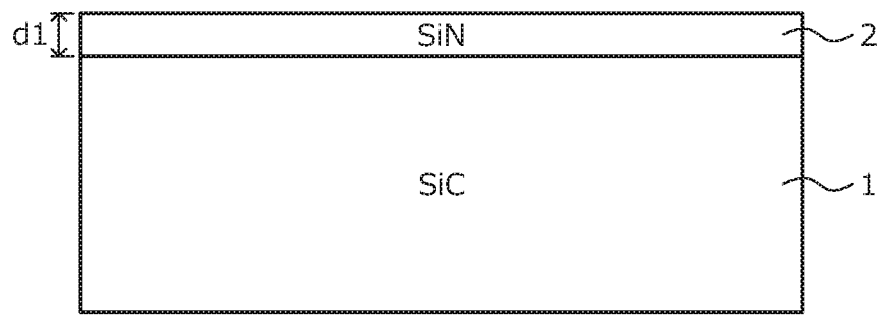
FIG. 3 is a cross-sectional view of a MOS capacitor during manufacture by the method of manufacturing the silicon carbide semiconductor device according to the embodiment.
Figure 4:
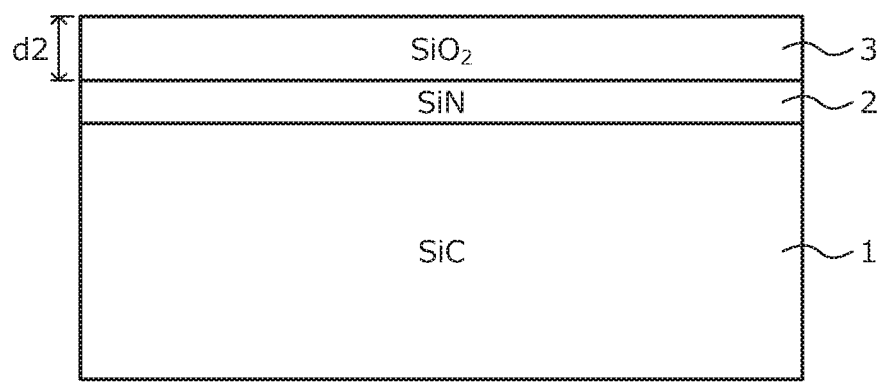
FIG. 4 is a cross-sectional view of the MOS capacitor during manufacture by the method of manufacturing the silicon carbide semiconductor device according to the embodiment.
Figure 5:
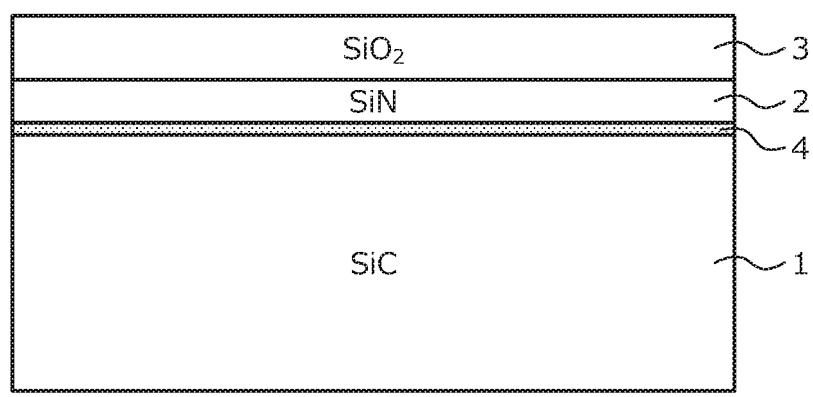
FIG. 5 is a cross-sectional view of the MOS capacitor during manufacture by the method of manufacturing the silicon carbide semiconductor device according to the embodiment.

FIGS. 3, 4, and 5 are cross-sectional views of a MOS capacitor during manufacture by the method of manufacturing the silicon carbide semiconductor device according to the embodiment. First, an n-type silicon carbide semiconductor base 1 is prepared. The n-type silicon carbide semiconductor base 1 may be a silicon carbide semiconductor substrate of an n-type, or may be that which an n-type epitaxial layer is formed by epitaxial growth on a front surface of an n-type silicon carbide semiconductor substrate.

Next, the silicon nitride film 2 of a thickness d1 in a range from, for example, about 1 [nm] to 3 [nm] is deposited on a front surface (for example, (0001) plane (Si face)) of the n-type silicon carbide semiconductor base 1, by the ALD method, where a temperature (film formation temperature) inside a reactor (chamber) of the ALD equipment is set to be in a range from, for example, 300 degrees C. to 500 degrees C. This deposition process corresponds to the first deposition process at step S3 depicted in FIG. 1. Further, the film formation temperature when the silicon nitride film 2 is deposited using the ALD method may be about 350 degrees C. In FIG. 2, as described, when the silicon nitride film 2 is deposited by the ALD method, the precursor is a source gas of silicon atoms and the reactant is a source gas of nitrogen atoms. As described with reference to FIG. 2, as the source gas of silicon atoms, for example, 3DMAS may be given as an example. The source gas of silicon atoms is not limited to 3DMAS and may be another organic silicon compound or the like. Further, as described with reference to FIG. 2, as the source gas of nitrogen atoms, a mixed gas of a gas that includes nitrogen and a gas that includes hydrogen may be given as an example. The source gas of silicon atoms is injected in a gas state into the reactor of the ALD equipment. The source gas of nitrogen atoms is made into a plasma state in the ALD equipment and injected into the reactor of the ALD equipment.

In the formation of the silicon nitride film 2 by the ALD method, the thickness of the single-stacked film that may be deposited by one cycle is 0.17 Å/cycle and therefore, the number of cycles to obtain the silicon nitride film 2 having the thickness d1 of about 1 [nm] is 60 cycles. Use of the ALD method, fills the entire surface of the n-type silicon carbide semiconductor base 1 with atoms, increasing uniformity of the film quality of the silicon nitride film 2 and enabling the silicon nitride film 2 that is thin to be obtained. The state up to here is depicted in FIG. 3.

Next, a silicon oxide film 3 having a thickness d2 in a range from, for example, about 20 [nm] to 100 [nm] is deposited on the silicon nitride film 2. The deposition process of the silicon oxide film 3 corresponds to the second deposition process at step S4 depicted in FIG. 1. The deposition process of the silicon oxide film 3 uses the ALD method. The film formation temperature when the silicon oxide film 3 is deposited using the ALD method is, for example, a temperature in a range from about 300 degrees C. to 850 degrees C. The film formation temperature when the silicon oxide film 3 is deposited using the ALD method, for example, may be about 400 degrees C.

In FIG. 2, as described, when the silicon oxide film 3 is deposited using the ALD method, the precursor is a source gas of silicon atoms and the reactant is a source gas of oxygen atoms. As the source gas of silicon atoms, 3DMAS may be given, for example. Further, as the source gas of oxygen atoms, a gas ($O_2$) that includes oxygen may be given as an example. The source gas of silicon atoms is injected in a gas state into the reactor of the ALD equipment. The source gas of oxygen atoms is made into a plasma state in the ALD equipment and is injected into the reactor of the ALD equipment.

In the formation of the silicon oxide film 3 by the ALD method, the thickness of the single-stacked film that may be deposited by one cycle is 0.67 Å/cycle and therefore, the number of cycles to obtain the silicon oxide film 3 having the thickness d2 of about 20 [nm] is 300 cycles. The silicon oxide film 3 may be a HTO film. When the silicon oxide film 3 is a HTO film, the deposition process of the silicon oxide film 3 may use a general deposition method of depositing a HTO film. The state up to here is depicted in FIG. 4.

Next, after the silicon oxide film 3 is deposited, for example, in a gas atmosphere that includes oxygen, heat treatment is performed. The heat treatment, for example, is performed at a temperature in a range from about 1100 degrees C. to 1350 degrees C. for a process time in a range from about 2 minutes to 30 minutes. Oxidation of the n-type silicon carbide semiconductor base 1 progresses with increasing temperature of the heat treatment and therefore, when the temperature during the heat treatment is set to be high, the process time of the heat treatment is shortened. The heat treatment, for example, may be performed for about 30 minutes when the temperature is 1100 degrees C., and may be performed for about 2 minutes when the temperature is 1350 degrees C. The state up to here is depicted in FIG. 5. Thus, nitrogen may be introduced at an interface 4 of the n-type silicon carbide semiconductor base 1 and the silicon oxide film 3.

In FIG. 5, while an example is given in which after the heat treatment performed after the silicon oxide film 3 is deposited, the silicon nitride film 2 is present between the silicon oxide film 3 and the interface 4 of the n-type silicon carbide semiconductor base 1 and the silicon oxide film 3, provided that nitrogen is introduced at the interface 4 of the n-type silicon carbide semiconductor base 1 and the silicon oxide film 3, the silicon nitride film 2 needs not be formed between the n-type silicon carbide semiconductor base 1 and the silicon oxide film 3. Subsequently, a gate electrode is formed on the silicon oxide film 3 and a rear electrode is formed at the entire rear surface of the n-type silicon carbide semiconductor base 1, thereby completing the MOS capacitor.

Figure 6:
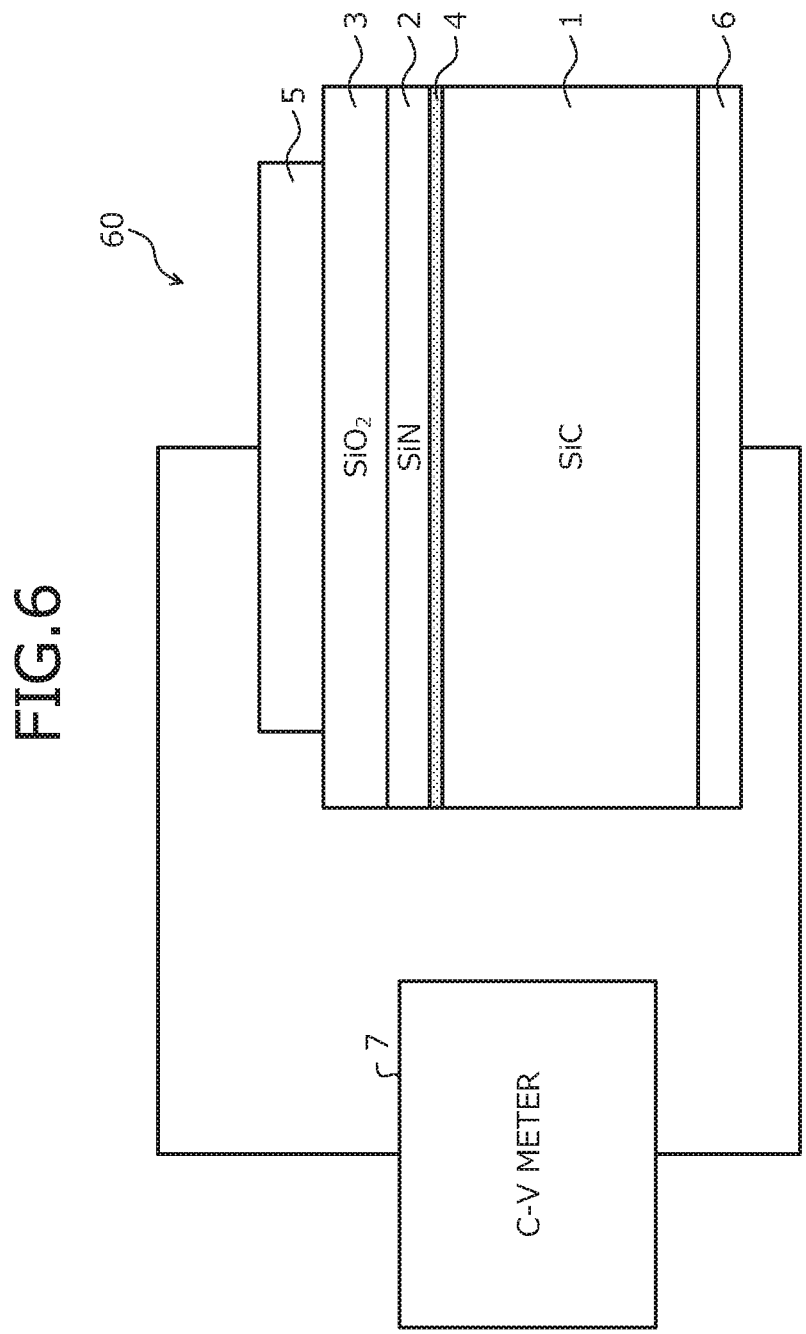
FIG. 6 is a diagram of an example of measurement and configuration of a MOS capacitor manufactured by the method of manufacturing the silicon carbide semiconductor device according to the embodiment.

Next, a method of measuring the interface state density of the interface 4 of the n-type silicon carbide semiconductor base 1 and the silicon nitride film 2 (or the silicon oxide film 3) will be described. FIG. 6 is a diagram of an example of measurement and configuration of a MOS capacitor manufactured by the method of manufacturing the silicon carbide semiconductor device according to the embodiment. A measurement example verifying reduction of the interface state density of the interface 4 of the n-type silicon carbide semiconductor base 1 and the silicon oxide film 3 will be described using FIG. 6.

First, a MOS capacitor 60 is fabricated according to the method of manufacturing the silicon carbide semiconductor device according to the embodiment. In particular, after formation of the silicon oxide film 3 at the front surface of the n-type silicon carbide semiconductor base 1, under a room temperature environment, a gate electrode (aluminum gate electrode) 5 containing aluminum is vapor deposited on the silicon oxide film 3, so has to have a dotted planar shape as viewed from the front surface of the n-type silicon carbide semiconductor base 1. Further, aluminum is vapor deposited at the entire rear surface of the n-type silicon carbide semiconductor base 1, thereby forming a rear electrode (aluminum rear electrode) 6. As a result, the MOS capacitor 60 (first example) is obtained.

Next, for comparison to verify the effect of reduction of the interface state density of the interface 4 of the n-type silicon carbide semiconductor base 1 and the silicon oxide film 3 in the MOS capacitor 60 according to the first example, a MOS capacitor (FIG. 13) (first comparison example) was fabricated by forming a gate insulating film on a front surface of an n-type silicon carbide semiconductor base in an atmosphere containing dry oxygen and by performing heat treatment using a gas containing nitric oxide. Further, a MOS capacitor (second comparison example) was fabricated in which a gate insulating film was formed by performing heat treatment in a gas atmosphere that contains nitrogen instead of heat treatment in a gas atmosphere containing oxygen, after a silicon nitride film and a silicon oxide film were formed on the front surface of the silicon carbide semiconductor base similarly to the method of manufacturing the silicon carbide semiconductor device according to the embodiment.

Figure 7:
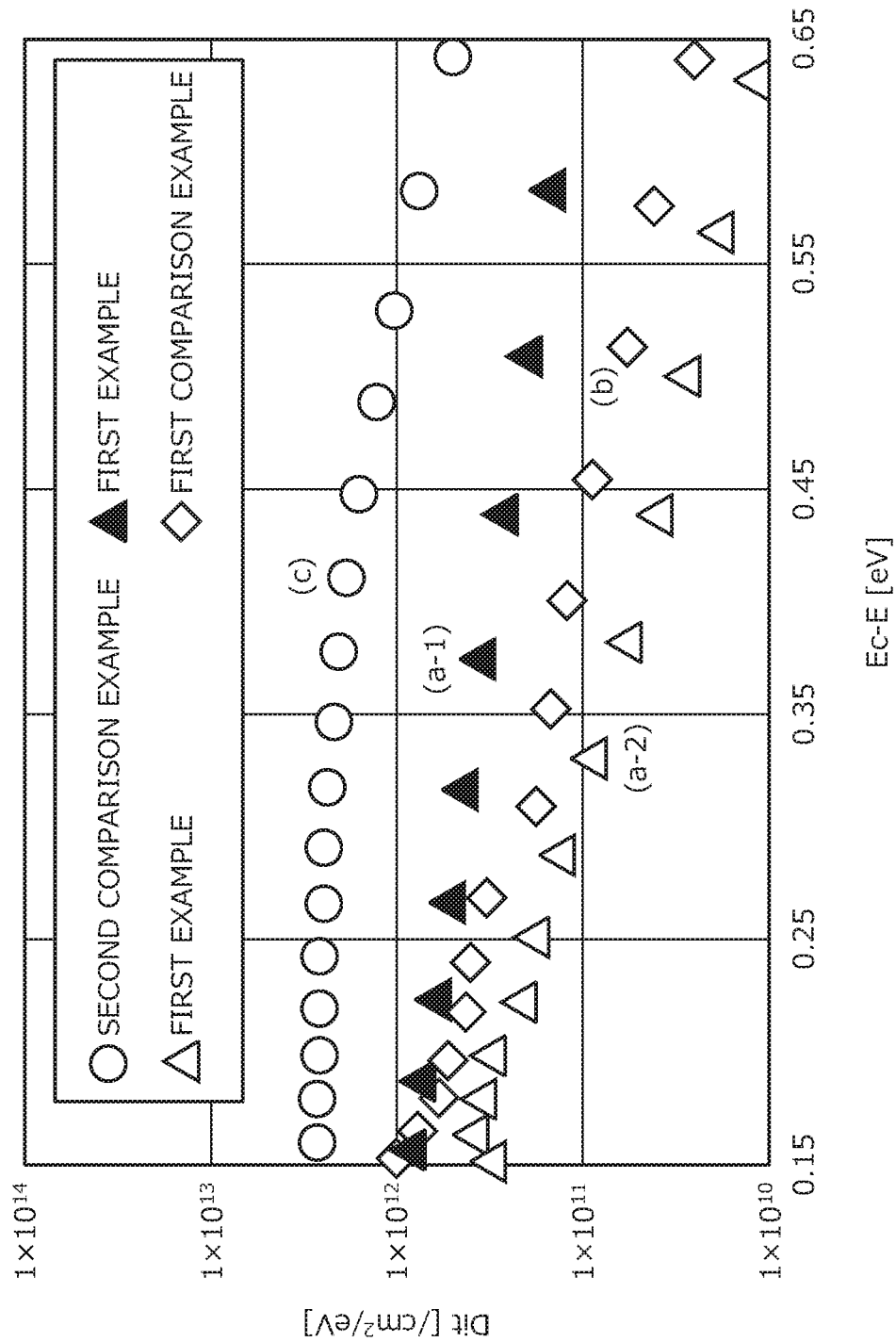
FIG. 7 is a characteristics diagram depicting a relationship of energy level and interface state density obtained from results of measurement of the MOS capacitor according to a first example and MOS capacitors of first and second comparison examples.

Next, electrostatic capacity of the completed MOS capacitor 60 according to the first example and electrostatic capacity of the MOS capacitors of the first and the second comparison examples were measured by a C-V (capacitance-voltage) meter 7 and based on the electrostatic capacity, an interface state density Dit of the interface of the silicon carbide semiconductor base and the silicon oxide film that is the gate insulating film was calculated. Results are depicted in FIG. 7. From the results depicted in FIG. 7, a difference of the interface state density of the interface of the silicon carbide semiconductor base and the gate insulating film was verified for the MOS capacitor 60 according to the first example and the MOS capacitors of the first and the second comparison examples.

FIG. 7 is a characteristics diagram depicting a relationship of energy level and interface state density obtained from the results of measurement of the MOS capacitor according to the first example and the MOS capacitors of the first and the second comparison examples. In FIG. 7, a horizontal axis is energy level (Ec-E) from a conduction band Ec of the silicon carbide semiconductor base to an interface state E of the interface of the silicon carbide semiconductor base and the silicon oxide film that is gate insulating film. In FIG. 7, a vertical axis is the interface state density Dit of the interface of the silicon carbide semiconductor base and the gate insulating film. The energy level (Ec-E) on the horizontal axis in FIG. 7 may be verified by varying voltage applied to the gate electrode 5 or by varying impurity concentration of a surface region of the front surface of the silicon carbide semiconductor base.

The MOS capacitor 60 according to the first example (a-1) was fabricated by performing heat treatment for about 30 minutes at a temperature of 1100 degrees C. after deposition of the silicon oxide film 3. The interface state density Dit (▲ plot) of the MOS capacitor 60 according to the first example (a-1) was confirmed to be about equal to an interface state density (◇ plot) of the MOS capacitor of the first comparison example (b). In this manner, the MOS capacitor 60 according to the first example (a-1) was confirmed to have an effect of reducing the interface state density to an extent about equal to that of the MOS capacitor of the first comparison example (b).

Further, the interface state density Dit (▲ plot) of the MOS capacitor 60 according to the first example (a-1) was confirmed to be greatly lower than the interface state density Dit (○ plot) of the MOS capacitor of the second comparison example (c). In this manner, the MOS capacitor 60 according to the first example (a-1) was confirmed to have an effect of reducing the interface state density by greater extent than the MOS capacitor of the second comparison example (c).

Further, the MOS capacitor 60 according to the first example (a-2) was fabricated by performing heat treatment at a temperature of 1350 degrees C. after the silicon oxide film 3 was deposited. When the temperature in the heat treatment performed in the dry oxygen atmosphere after the silicon oxide film 3 is deposited is high, reaction from the silicon nitride film 2 (SiN film) formed in the ALD equipment to silicon oxynitride (SiON) is promoted, bond density of the silicon oxynitride (SiON) at the interface 4 of the n-type silicon carbide semiconductor base 1 and the silicon oxide film 3, i.e., nitrogen concentration at the interface 4 of the n-type silicon carbide semiconductor base 1 and the silicon oxide film 3 is presumed to increase.

Therefore, the interface state density Dit (Δ plot) of the MOS capacitor 60 according to the first example (a-2) became lower than the interface state density Dit (◇ plot) of the MOS capacitor of the first comparison example (b). Thus, the MOS capacitor 60 according to the first example (a-2) has an effect of reducing the interface state density more than that of the MOS capacitor of the first comparison example (b). Therefore, according to the MOS capacitor 60 according to the first example (a-2), electron traps formed by the interface 4 of the n-type silicon carbide semiconductor base 1 and the silicon oxide film 3 decreased, enabling channel resistance (i.e., ON resistance) to be reduced.

Further, the MOS capacitor 60 manufactured by the method of manufacturing the silicon carbide semiconductor device according to the embodiment is an example of fabrication using a semiconductor chip cut into individual chips from a semiconductor wafer containing silicon carbide. While internal stress of the silicon nitride film 2 is large, in the embodiment, the thickness of the silicon nitride film 2 is thin and in a range from about 1 [nm] to 3 [nm]. In addition, the thickness of the silicon nitride film 2 is further reduced by the heat treatment performed in the gas atmosphere including oxygen after deposition of the silicon nitride film 2 and the silicon oxide film 3, or the silicon nitride film 2 disappears. Therefore, adverse effects of the internal stress of the silicon nitride film 2 on the semiconductor wafer are small.

Further, in the method of manufacturing the silicon carbide semiconductor device according to the embodiment, when the thickness d1 of the silicon nitride film 2 is 5 [nm] or more, the inventors confirmed that hysteresis characteristics of C-V by the MOS capacitor 60 rapidly declines. When the hysteresis characteristics of C-V by the MOS capacitor 60 decline, deep trap levels of the n-type silicon carbide semiconductor base 1 are presumed to increase. Therefore, the thickness of the silicon nitride film 2 in the method of manufacturing the silicon carbide semiconductor device according to the embodiment may be in a range of about 1 [nm] to 3 [nm].

Figure 8:
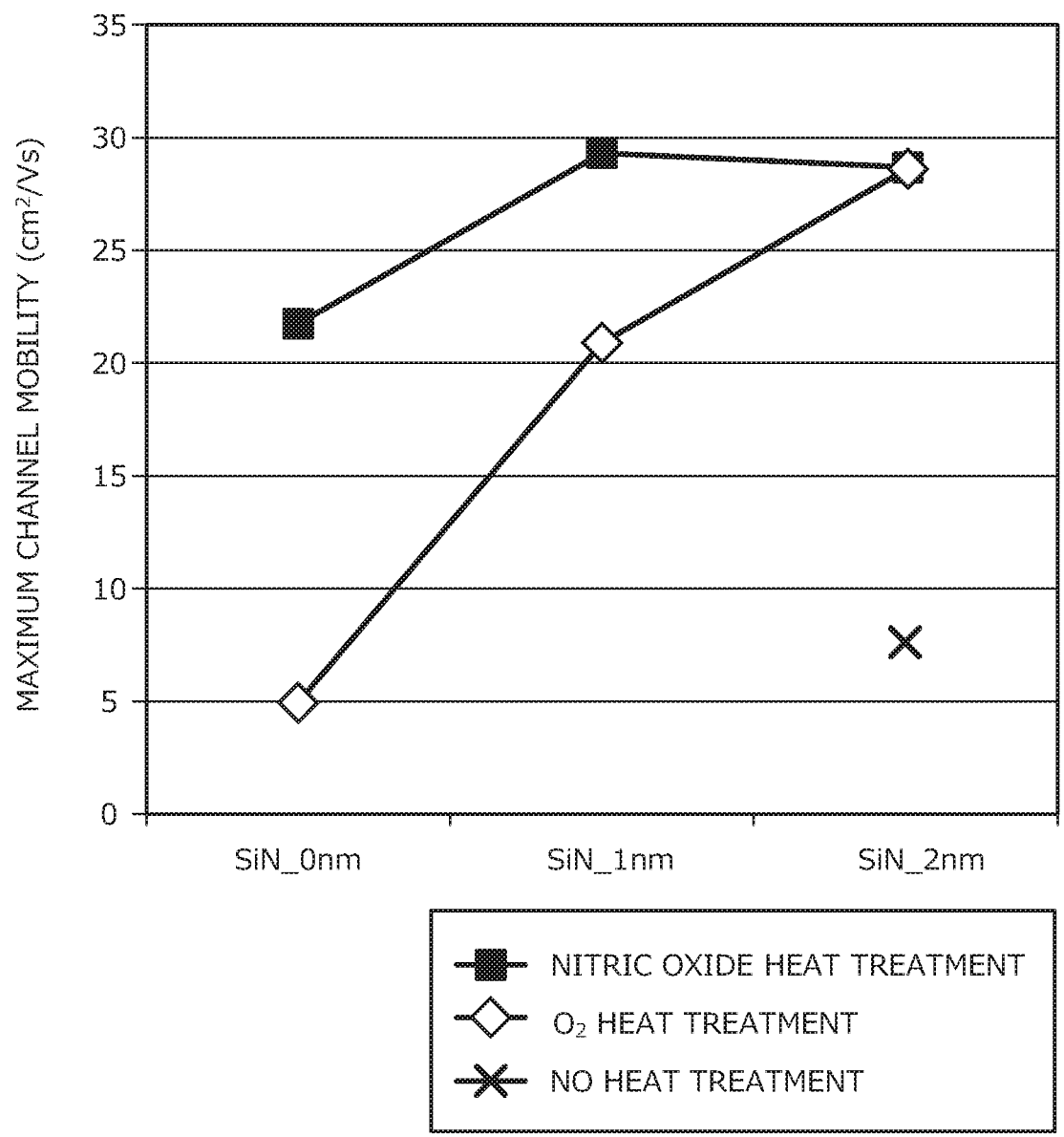
FIG. 8 is a characteristics diagram depicting channel mobility of a silicon carbide semiconductor device according to a second example.
Figure 9:
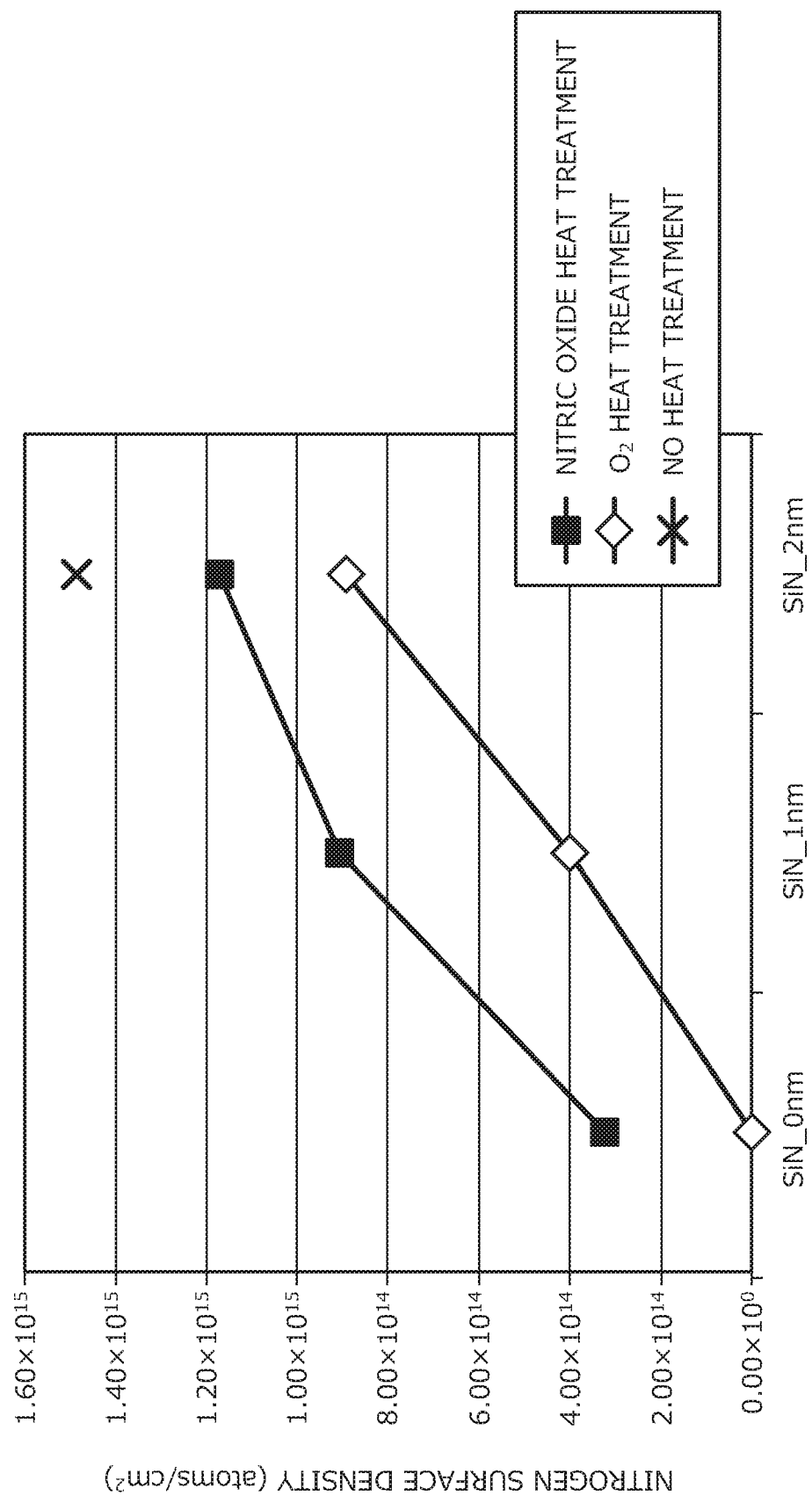
FIG. 9 is a characteristics diagram depicting nitrogen surface density at an interface of a silicon carbide semiconductor base and a gate insulating film of the silicon carbide semiconductor device according to the second example.
Figure 10:
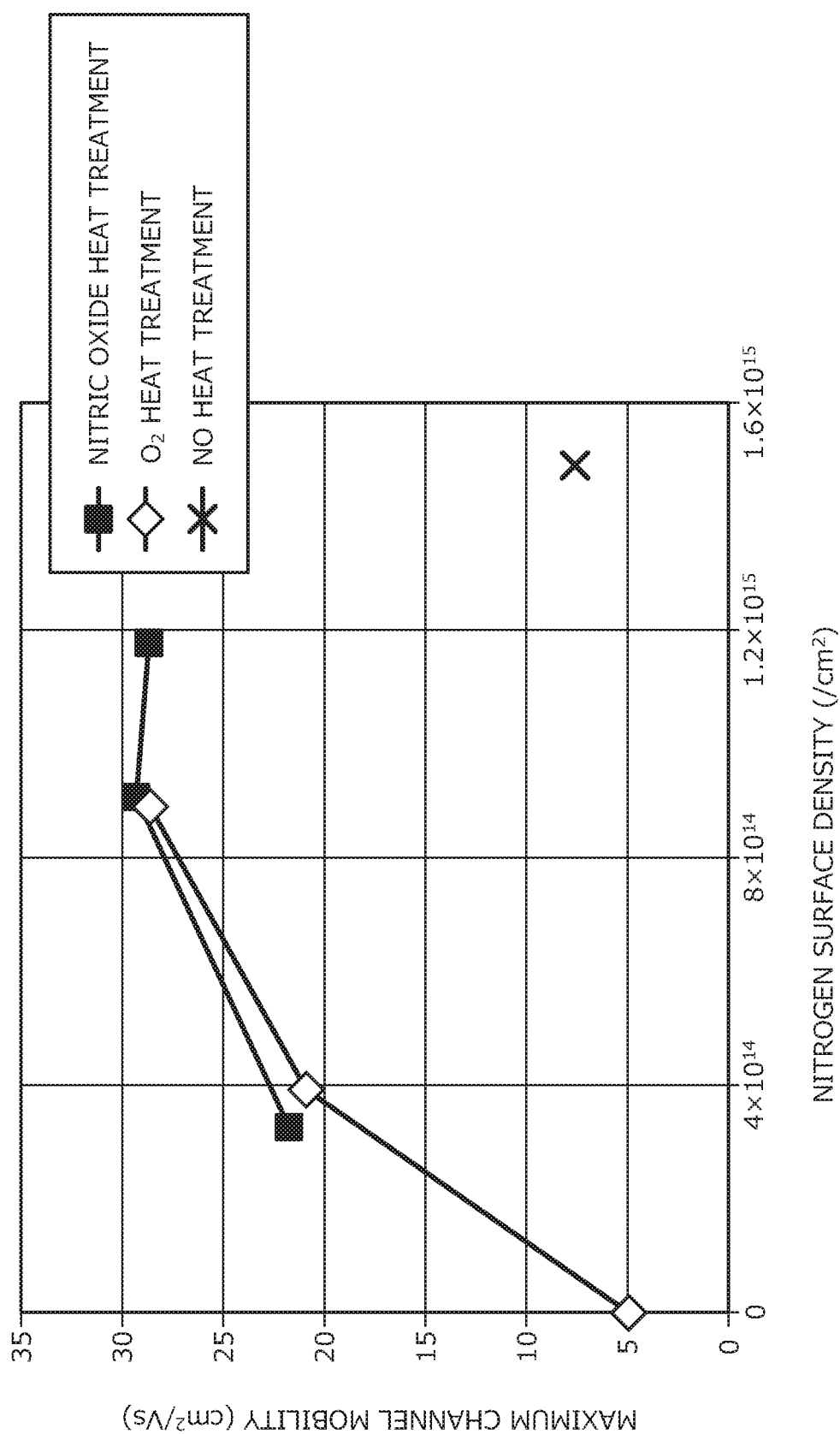
FIG. 10 is a characteristics diagram depicting a relationship of channel mobility and nitrogen surface density at the interface of the silicon carbide semiconductor base and the gate insulating film of the silicon carbide semiconductor device according to the second example.

Next, channel mobility was verified. FIG. 8 is a characteristics diagram depicting channel mobility of a silicon carbide semiconductor device according to a second example. FIG. 9 is a characteristics diagram depicting nitrogen surface density at the interface of the silicon carbide semiconductor base and the gate insulating film of the silicon carbide semiconductor device according to the second example. FIG. 10 is a characteristics diagram depicting a relationship of channel mobility and nitrogen surface density at the interface of the silicon carbide semiconductor base and the gate insulating film of the silicon carbide semiconductor device according to the second example. First, plural MOSFETs (the second examples) were fabricated according to the described method of manufacturing the silicon carbide semiconductor device according to the embodiment, the plural MOSFETs respectively having at the interface of the silicon carbide semiconductor base and the gate insulating film, silicon nitride films of differing thicknesses.

Herein, as a sample of the second example, 3 samples of silicon nitride films were prepared respectively having thicknesses of 0 [nm], 1 [nm], and 2 [nm] (in FIGS. 8 and 9, indicated as SiN_0 nm, SiN_1 nm, and SiN_2 nm, respectively). For each of the three samples, maximum channel mobility was measured under three heat treatment conditions including a case where a gas species of the heat treatment was oxygen (oxygen ($O_2$) heat treatment), a case where a gas species of the heat treatment was nitric oxide (nitric oxide (NO) heat treatment), and a case where the heat treatment was not performed (no heat treatment). The results are depicted in FIG. 8.

Further, for the three samples of the second example, the nitrogen surface density at the interface of the silicon carbide semiconductor base and the gate insulating film under the three heat treatment conditions above was measured by an x-ray photoelectron spectroscopy (XPS) method. The results are depicted in FIG. 9. In the results depicted in FIGS. 8 and 9, for the oxygen heat treatment and the nitric oxide heat treatment, the heat treatment temperature was set in a range from 1100 degrees C. to 1350 degrees C. Herein, under all of the heat treatment conditions, the thickness of the silicon nitride film being 0 [nm] (SiN_0 nm: no silicon nitride film) corresponds to a structure (conventional structure) in which the silicon nitride film is not provided.

From the results depicted in FIG. 8, it was confirmed that in the sample of the oxygen heat treatment and the sample of the nitric oxide heat treatment, the maximum channel mobility increased accompanying increased thickness of the silicon nitride film. However, in the results depicted in FIG. 8, characteristics of the sample of the oxygen heat treatment and the sample of the nitric oxide heat treatment did not match. In particular, when the thickness of the silicon nitride film was 0 [nm], in the sample of the oxygen heat treatment, the maximum channel mobility was lower than that of the sample of the nitric oxide heat treatment. In addition, when the thickness of the silicon nitride film was 2 [nm], in sample of the oxygen heat treatment, the maximum channel mobility was substantially equal to that of the sample of the nitric oxide heat treatment.

In other words, it was found that in the sample of the oxygen heat treatment, as compared to the sample of the nitric oxide heat treatment, the rate of increase of the maximum channel mobility due to increased thickness of the silicon nitride film was large, and an effect of improved interface characteristics of the interface of the silicon carbide semiconductor base and the gate insulating film obtained by increasing the thickness of the silicon nitride film was large. Further, from the results depicted in FIG. 8, it was confirmed that in the sample without the heat treatment and in which the thickness of the silicon nitride film was 2 [nm], the maximum channel mobility was significantly lower as compared to the sample with the oxygen heat treatment and in which the thickness of the silicon nitride film was 2 [nm] and the sample with the nitric oxide heat treatment and in which the thickness of the silicon nitride film was 2 [nm].

From the results depicted in FIG. 9, it was found that in both the sample of the oxygen heat treatment and the sample of the nitric oxide heat treatment, accompanying increased thickness of the silicon nitride film, the nitrogen surface density at the interface of the silicon carbide semiconductor base and the gate insulating film increased. In the sample with the oxygen heat treatment and without the silicon nitride film (SiN_0 nm), there was no nitrogen supply source to the interface of the silicon carbide semiconductor base and the gate insulating film. Therefore, the nitrogen surface density at the interface of the silicon carbide semiconductor base and the gate insulating film was at a level undetectable by the XPS method ($=0.00 \times 10^0$ atoms/cm$^2$).

Further, compared to the nitrogen surface density ($=3.2 \times 10^{14}$/cm$^2$) of the sample that was with the nitric oxide heat treatment and without the silicon nitride film (SiN_0 nm) and that was the conventional structure, it was confirmed that in the sample of the oxygen heat treatment and in the sample of the nitric oxide heat treatment, the nitrogen surface density at the interface of the silicon carbide semiconductor base and the gate insulating film was a higher concentration by about 2 times to 4 times. Further, it was found that compared to the sample in which the thickness of the silicon nitride film was 2 [nm] (SiN_2 nm), the nitrogen surface density at the interface of the silicon carbide semiconductor base and the gate insulating film was highest for the sample without the heat treatment and even with the nitric oxide heat treatment, was lower than that for the sample without the heat treatment.

Further, a relationship of the maximum channel mobility and the nitrogen surface density at the interface of the silicon carbide semiconductor base and the gate insulating film derived from the results depicted in FIG. 8 and the results depicted in FIG. 9 is depicted in FIG. 10. From the results depicted in FIG. 10, it was found that in the sample of the oxygen heat treatment and the sample of the nitric oxide heat treatment, the maximum channel mobility increased together with the nitrogen surface density at the interface of the silicon carbide semiconductor base and the gate insulating film, and the maximum channel mobility corresponding to the nitrogen surface density at the interface of the silicon carbide semiconductor base and the gate insulating film had approximately the same relationship.

Further, as depicted in FIG. 10, in the sample of the oxygen heat treatment and the sample of the nitric oxide heat treatment, the maximum channel mobility had a maximum value near the nitrogen surface density of $9 \times 10^{14}$/cm$^2$ and these respective maximum values were 28.7 cm$^2$/Vs and 29.3 cm$^2$/Vs, respectively. In the nitric oxide heat treatment, taking as a reference, the maximum channel mobility of 21.7 cm$^2$/Vs of the sample in which the thickness of the silicon nitride film was 0 [nm] (SiN_0 nm), it was found that the rate of increase of the maximum channel mobility of the sample of the oxygen heat treatment and the sample of the nitric oxide heat treatment was 32% and 35%, respectively.

Further, from the results depicted in FIG. 10, when the nitrogen surface density at the interface of the silicon carbide semiconductor base and the gate insulating film is in a range from $6 \times 10^{14}$/cm$^2$ to $1.2 \times 10^{15}$/cm$^2$, taking as a reference, the maximum channel mobility of 21.7 cm$^2$/Vs of the sample with the nitric oxide heat treatment and in which the thickness of silicon nitride film was 0 [nm] (SiN_0 nm), it was found that in the sample of the oxygen heat treatment and the sample of the nitric oxide heat treatment, the maximum channel mobility may be increased about 15% to 35%.

Figure 11:
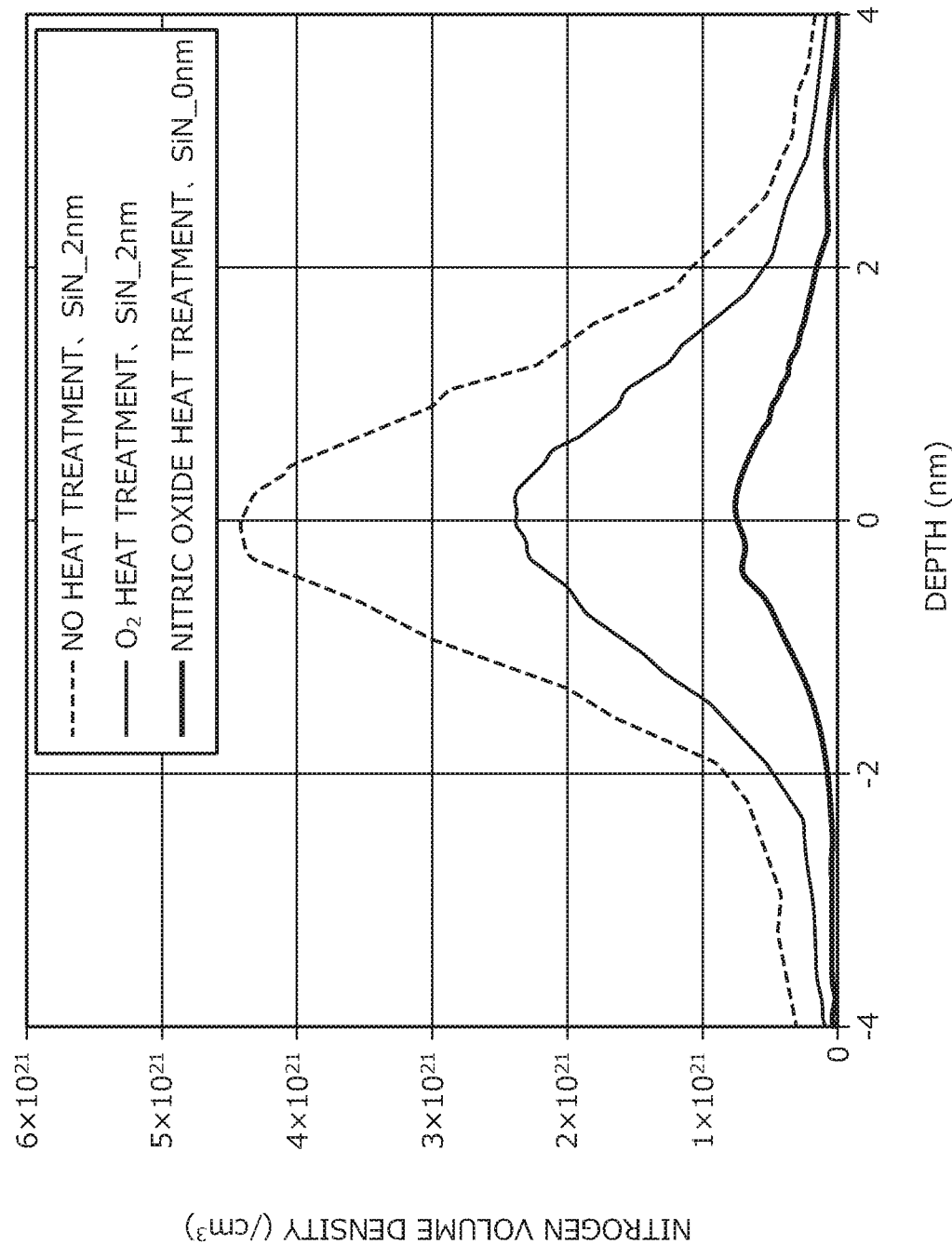
FIG. 11 is a characteristics diagram depicting a nitrogen volume density profile near the interface of the silicon carbide semiconductor base and the gate insulating film of the silicon carbide semiconductor device according to the second example.

Next, nitrogen volume density near the interface of the silicon carbide semiconductor base and the gate insulating film was verified. FIG. 11 is a characteristics diagram depicting a nitrogen volume density profile near the interface of the silicon carbide semiconductor base and the gate insulating film of the silicon carbide semiconductor device according to the second example. FIG. 11 depicts the nitrogen volume density profile measured by secondary ion mass spectrometry (SIMS) near the interface of the silicon carbide semiconductor base and the gate insulating film.

In FIG. 11, a horizontal axis indicates the interface of the silicon carbide semiconductor base and the silicon nitride film (or the silicon oxide film) as 0 [nm]; indicates as a positive value, depth toward an inside of the silicon carbide semiconductor base in a direction of increasing depth from the interface; and indicates as a negative value, depth toward an inside of the silicon nitride film (or the silicon oxide film) in a direction of increasing depth from the interface. In FIG. 11, a vertical axis indicates nitrogen volume density. Further, in FIG. 11, three samples for which heat treatment conditions include no heat treatment (silicon nitride film having a thickness of 2 [nm]), the oxygen heat treatment (silicon nitride film having a thickness of 2 [nm]), and the nitric oxide heat treatment (no silicon nitride film).

From the results depicted in FIG. 11, it was confirmed that in each of the samples for no heat treatment, the oxygen heat treatment, and the nitric oxide heat treatment, the half widths of the nitrogen volume density profiles where 2.5 [nm], 2.6 [nm], and 2.1 [nm], respectively. In other words, it was confirmed that the silicon oxide film constituting the gate insulating film is stacked on a surface of the silicon carbide semiconductor base, via the silicon nitride film, whereby in the samples of no heat treatment and the oxygen heat treatment, the half width was about 0.5 nm wider than that in the sample of the conventional nitric oxide heat treatment in which the silicon nitride film was not formed.

Figure 12:
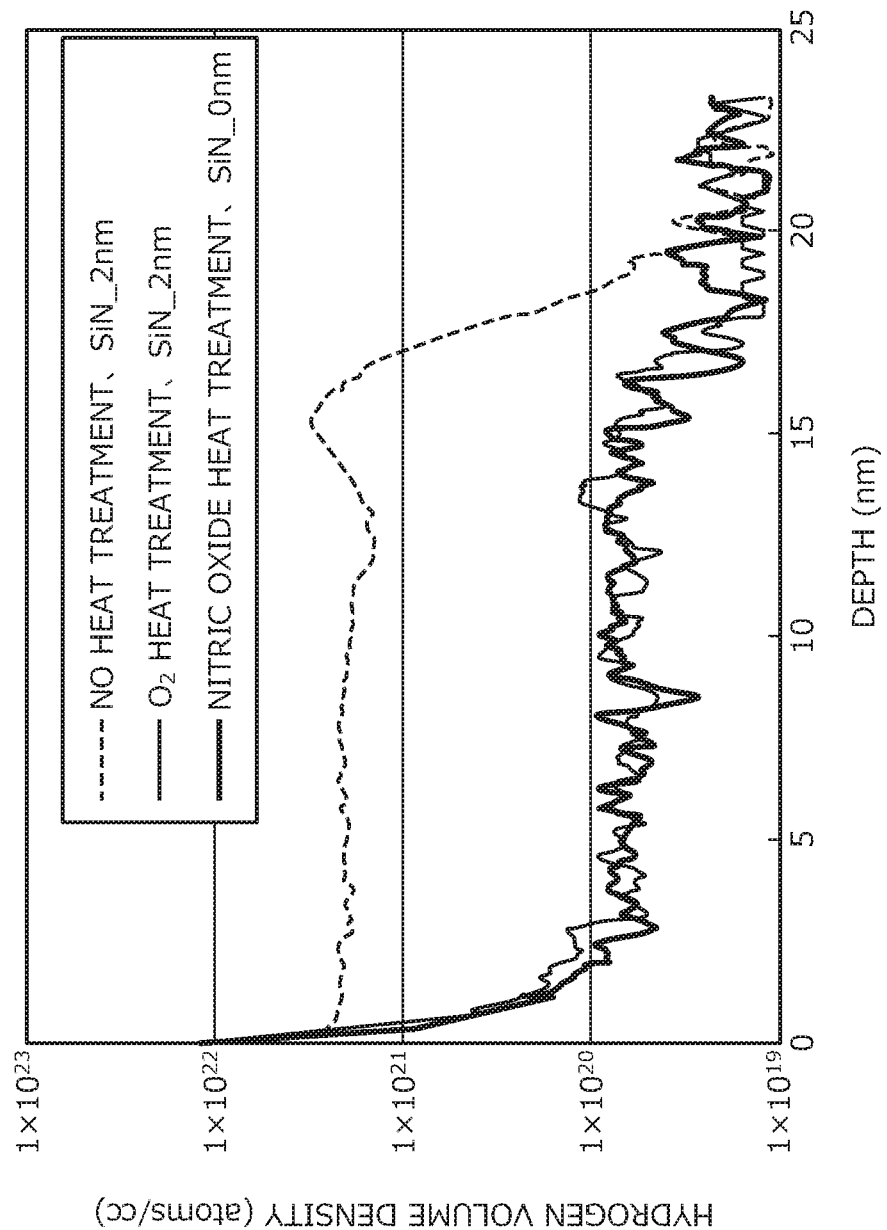
FIG. 12 is a characteristics diagram depicting a profile of volume density of hydrogen in the gate insulating film of the silicon carbide semiconductor device according to the second example.

Next, the volume density of hydrogen in the silicon oxide film constituting the gate insulating film was verified. FIG. 12 is a characteristics diagram depicting a profile of the volume density of hydrogen in the gate insulating film of the silicon carbide semiconductor device according to the second example. FIG. 12 depicts a profile of the volume density of hydrogen measured by SIMS in the silicon oxide film constituting the gate insulating film. Samples depicted in FIG. 12, similarly to FIG. 11, include three: no heat treatment (silicon nitride film having a thickness of 2 [nm]), the oxygen heat treatment (silicon nitride film having a thickness of 2 [nm]), and the nitric oxide heat treatment (no silicon nitride film). For the sample of no heat treatment, it was found that hydrogen concentration in the gate insulating film was high, exceeding $1 \times 10^{21}$/cm$^3$. The following two points may be given as reasons for a large amount of hydrogen being included in the gate insulating film of the sample of no heat treatment.

A first reason is that hydrogen is included in the gas used when the gate insulating film is formed by the ALD method. A second reason is that the film formation temperature of the silicon nitride film was low, at a temperature in a range from 300 degrees C. to 400 degrees C., that is, a low temperature condition whereby hydrogen in the gate insulating film remains. In forming the silicon nitride film on the order of nm, relatively low-temperature CVD is necessary and it is presumed that a large amount of hydrogen remaining in the gate insulating film during formation of the silicon nitride film is unavoidable. In the sample of no heat treatment, it is presumed that the large amount of hydrogen included in the gate insulating film is a reason for the maximum channel mobility becoming significantly lower as described above. On the other hand, it was found that in the oxygen heat treatment and the nitric oxide heat treatment, by heat treatment at a temperature of 1100 degrees C. or higher, the volume density of the hydrogen in the gate insulating film decreased to $1\times10^{20}/cm^3$ or less, and these heat treatment temperature conditions and hydrogen density conditions in the gate insulating film were important factors for obtaining favorable channel mobility characteristics.

As described in the embodiment, according to the embodiment, on the front surface of a silicon carbide semiconductor base, a silicon nitride film having a thickness in a range from 1 [nm] to 3 [nm] is formed by an atomic layer deposition method, and after a gate insulating film is formed on the silicon nitride film, heat treatment is performed in an atmosphere that includes oxygen. As a result, a structure in which the nitrogen surface density at the interface of the silicon carbide semiconductor base and the gate insulating film is increased to $6\times10^{14}/cm^2$ to $1.2\times10^{15}/cm^2$ is obtained, and as compared to a conventional structure, the channel mobility may be increased, enabling interface characteristics of the interface of the silicon carbide semiconductor base and the gate insulating film to be improved.

Further, when the heat treatment after the first and the second deposition processes is performed using a gas that does not include oxygen, the introduction of nitrogen at the interface of the silicon carbide semiconductor base and the gate insulating film is insufficient, and a large improvement in characteristics of the interface of the silicon carbide semiconductor base and the gate insulating film is not to be expected. In contrast, according to the embodiment, the heat treatment after the first and the second deposition processes is performed using a gas that includes oxygen, enabling interface characteristics of the interface of the silicon carbide semiconductor base and the gate insulating film to be improved. Further, according to the embodiment, in the heat treatment after the first and the second deposition processes, without using nitric oxide or nitrous oxide as the gas to be introduced into the reactor, oxygen alone may be used. As a result, special equipment such as abatement equipment for detoxifying gas exhausted from the reactor need not be used. As a result, the silicon carbide semiconductor device for which interface characteristics of the interface of the silicon carbide semiconductor base and the gate insulating film are improved may be provided at low cost.

In the foregoing, the present invention, without limitation to the described embodiment, may be modified within a range not departing from the spirit of the invention. For example, the deposition method of the silicon oxide film constituting the gate insulating film is not limited to the ALD method and may be a low-pressure CVD method forming a HTO film.

The silicon carbide semiconductor device and the method of manufacturing a silicon carbide semiconductor device of the present invention achieve an effect in that substitution-element surface density at the interface of the silicon carbide semiconductor base and the gate insulating film is increased, whereby channel mobility may be increased.

As described, the silicon carbide semiconductor device and the method of manufacturing a silicon carbide semiconductor device according to the present invention us useful for a semiconductor device having a MOS gate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor base including silicon carbide; and
   a gate insulating film provided on a surface of the semiconductor base, wherein
   a nitrogen surface density at an interface of the semiconductor base and the gate insulating film is in a range of $6\times10^{14}/cm^2$ to $1.2\times10^{15}/cm^2$, wherein
   a half width of a peak of a nitrogen profile in a thickness direction in a region including the interface of the semiconductor base and the gate insulating film, is in a range of 2 nm to 4 nm.

2. The silicon carbide semiconductor device according to claim 1, wherein
   hydrogen volume densities in the gate insulating film and at the interface of the semiconductor base and the gate insulating film are $1\times10^{21}/cm^3$ or less.

3. The silicon carbide semiconductor device according to claim 2, wherein
   the hydrogen volume densities in the gate insulating film and at the interface of the semiconductor base and the gate insulating film are $1\times10^{20}/cm^3$ or less.

4. The silicon carbide semiconductor device according to claim 1, wherein
   the surface of the semiconductor base, forming the interface with the gate insulating film, is in a (0001) plane, a (000-1) plane, a (1-100) plane, or a (11-20) plane.

5. A method of manufacturing a silicon carbide semiconductor device, the method comprising:
   forming on a front surface of a semiconductor base including silicon carbide, a silicon nitride film having a thickness in a range of 1nm to 3 nm;
   forming on the silicon nitride film, a gate insulating film; and
   causing nitrogen atoms in the silicon nitride film to react with the semiconductor base by a heat treatment in an atmosphere that includes oxygen, after the forming of the gate insulating film.

6. The method according to claim 5, wherein causing the nitrogen atoms to react with the semiconductor base includes performing the heat treatment at a temperature in a range of 1100 degrees C. to 1350 degrees C.

7. The method according to claim 5, wherein the forming the silicon nitride film includes forming the silicon nitride film by a chemical vapor disposition method that includes an atomic layer deposition method.

* * * * *